United States Patent
Lien et al.

(10) Patent No.: US 9,564,458 B2
(45) Date of Patent: Feb. 7, 2017

(54) TFT SUBSTRATES AND THE MANUFACTURING METHOD THEREOF

(71) Applicant: Shenzhen China Star Optoelectronics Technology Co., Ltd., Shenzhen, Guangdong (CN)

(72) Inventors: Shui-chih Lien, Guangdong (CN); Yuan Xiong, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 103 days.

(21) Appl. No.: 14/433,630

(22) PCT Filed: Dec. 9, 2014

(86) PCT No.: PCT/CN2014/093349
§ 371 (c)(1),
(2) Date: Apr. 3, 2015

(87) PCT Pub. No.: WO2016/082250
PCT Pub. Date: Jun. 2, 2016

(65) Prior Publication Data
US 2016/0148956 A1    May 26, 2016

(30) Foreign Application Priority Data

Nov. 26, 2014 (CN) .......................... 2014 1 0698801

(51) Int. Cl.
*H01L 27/12* (2006.01)
*H01L 29/66* (2006.01)
(Continued)

(52) U.S. Cl.
CPC ..... *H01L 27/1255* (2013.01); *G02F 1/136209* (2013.01); *G02F 1/136227* (2013.01);
(Continued)

(58) Field of Classification Search
CPC .......... G02F 1/136209; H01L 27/1255; H01L 27/1259; H01L 23/5226; H01L 21/76802; H01L 23/5222; H01L 27/1248; H01L 21/283; H01L 23/528; H01L 2924/0002; H01L 29/78678; H01L 27/124; H01L 29/78669; H01L 29/66765
See application file for complete search history.

(56) References Cited

U.S. PATENT DOCUMENTS

| 7,645,649 B1 * | 1/2010 | Lai ................... G02F 1/136209 438/149 |
| 2009/0206339 A1 * | 8/2009 | Park ...................... B82Y 20/00 257/59 |

FOREIGN PATENT DOCUMENTS

KR        100495793 B1 *  6/2005   ............. G02F 1/136

* cited by examiner

Primary Examiner — Joshua King
(74) Attorney, Agent, or Firm — Andrew C. Cheng

(57) ABSTRACT

A TFT substrate and the manufacturing method thereof are disclosed. The method includes: providing a substrate; forming a gate electrode on the substrate; forming a first insulation layer and an active layer on the gate electrode in turn; forming a first black matrix on the active layer; forming a source electrode and a drain electrode on the first black matrix; forming a second insulation layer on the source electrode and the drain electrode; and forming a pixel electrode on the second insulation layer. The pixel electrode is electrically connected to the source electrode or the drain electrode via the second insulation layer. In this way, the masking effect of the display panel assembled by the TFT substrate can be ensured. In addition, the coupling capacitance between the data line and the scanning line may be reduced.

6 Claims, 8 Drawing Sheets

(51) Int. Cl.
*H01L 29/786* (2006.01)
*G02F 1/1362* (2006.01)

(52) U.S. Cl.
CPC ........ *H01L 27/124* (2013.01); *H01L 27/1248* (2013.01); *H01L 27/1259* (2013.01); *H01L 29/66765* (2013.01); *H01L 29/78669* (2013.01); *H01L 29/78678* (2013.01); *H01L 2924/0002* (2013.01)

TFT SUBSTRATES AND THE MANUFACTURING METHOD THEREOF

BACKGROUND OF THE INVENTION

1. Field of the Invention

The present disclosure relates to liquid crystal display technology, and more particularly to a thin film transistor (TFT) substrate and the manufacturing method thereof.

2. Discussion of the Related Art

Curved TVs typically are characterized by attributes including better contrastness, a wider viewing angle, and better user experience, and thus are very popular to customers.

As the panel is curved to some degree, displacement may occur between the TFT substrate and the color filter (CF) substrate, which affects masking effects of the black matrix (BM) arranged on the CF substrate. FIG. 1 shows the masking effect of the BM 101 when the panel 100 has not been curved. FIG. 2 shows the masking effect of the BM 101 when the panel 100 has been curved. It can be seen from FIGS. 1 and 2 that a portion of light beams may emit out from a lateral side of the BM 101 after the panel 100 is curved. The light leakage effect affects the masking effect of the BM 101 such that the contrastness of the panel 100 is lowered down.

SUMMARY

A TFT substrate and the manufacturing method thereof can ensure the masking effect and can reduce the coupling capacitance between the data line and the scanning line may be reduced.

In one aspect, a manufacturing method of a TFT substrate includes: providing a substrate; forming a gate electrode on the substrate; forming a first insulation layer and an active layer on the gate electrode in turn; forming a first black matrix on the active layer; forming a source electrode and a drain electrode on the first black matrix;

forming a second insulation layer on the source electrode and the drain electrode; forming a pixel electrode on the second insulation layer, the pixel electrode being electrically connected to the source electrode or the drain electrode via the second insulation layer; wherein the step of forming the gate electrode further comprises forming at least one scanning line on the substrate, the scanning line being arranged on the same layer with the gate electrode, and wherein the first insulation layer further covers the scanning line, and the active layer has not covered the scanning line; wherein the step of forming the first black matrix further comprises forming a second black matrix on the scanning line, and the second black matrix being arranged on the same layer with the first black matrix; wherein the step of forming the source electrode and the drain electrode on the first black matrix further comprises forming a capacitance electrode on the second black matrix, the capacitance electrode being arranged on the same layer with the source electrode and the drain electrode, wherein the second insulation layer further covers the capacitance electrode, and the pixel electrode being electrically connected to the capacitance electrode via the second insulation layer; and wherein the first black matrix and the second matrix are made by black resin material.

Wherein the step of forming the first black matrix on the active layer further comprises: forming contacting holes respectively on the first black matrix and the second black matrix such that the source electrode and the drain electrode being contacted with the active layer via the contacting hole on the first black matrix, and the capacitance electrode being contacted with the first insulation layer via the contacting hole on the second black matrix.

Wherein the method further comprises: forming a photoresist layer between the pixel electrode and the second insulation layer; and forming an insulation protection layer between the photoresist layer and the pixel electrode.

Wherein the step of forming the photoresist layer between the pixel electrode and the second insulation layer further comprises forming a first contacting hold and a second contacting hole respectively in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed; wherein the step of forming the insulation protection layer between the photoresist layer and the pixel electrode further comprises: forming the insulation protection layer within the first contacting hole and the second contacting hole;

forming a third contacting hole within the insulation protection layer of the first contacting hole and the second contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

In another aspect, a manufacturing method of a TFT substrate includes: providing a substrate; forming a gate electrode on the substrate; forming a first insulation layer and an active layer on the gate electrode in turn; forming a first black matrix on the active layer; forming a source electrode and a drain electrode on the first black matrix; forming a second insulation layer on the source electrode and the drain electrode; and forming a pixel electrode on the second insulation layer, the pixel electrode being electrically connected to the source electrode or the drain electrode via the second insulation layer.

Wherein the step of forming the gate electrode further comprises forming at least one scanning line on the substrate, the scanning line being arranged on the same layer with the gate electrode, and wherein the first insulation layer further covers the scanning line, and the active layer has not covered the scanning line; wherein the step of forming the first black matrix further comprises forming a second black matrix on the scanning line, and the second black matrix being arranged on the same layer with the first black matrix; and wherein the step of forming the source electrode and the drain electrode on the first black matrix further comprises forming a capacitance electrode on the second black matrix, the capacitance electrode being arranged on the same layer with the source electrode and the drain electrode, wherein the second insulation layer further covers the capacitance electrode, and the pixel electrode being electrically connected to the capacitance electrode via the second insulation layer.

Wherein the step of forming the first black matrix on the active layer further comprises: forming contacting holes respectively on the first black matrix and the second black matrix such that the source electrode and the drain electrode being contacted with the active layer via the contacting hole on the first black matrix, and the capacitance electrode being contacted with the first insulation layer via the contacting hole on the second black matrix.

Wherein forming a photoresist layer between the pixel electrode and the second insulation layer; and forming an insulation protection layer between the photoresist layer and the pixel electrode.

Wherein the step of forming the photoresist layer between the pixel electrode and the second insulation layer further comprises forming a first contacting hold and a second contacting hole respectively in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed; wherein the step of forming the insulation protection layer between the photoresist layer and the pixel electrode further comprises: forming the insulation protection layer within the first contacting hole and the second contacting hole; forming a third contacting hole within the insulation protection layer of the first contacting hole and the third contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

In another aspect, a TFT substrate includes: a substrate; a gate electrode being arranged on the substrate; a first insulation layer and an active layer being arranged on the gate electrode in turn; a first black matrix being arranged on the active layer; a source electrode and a drain electrode being arranged on the first black matrix; a second insulation layer being arranged on the source electrode and the drain electrode; and a pixel electrode being arranged on the second insulation layer, and he pixel electrode being electrically connected to the source electrode or the drain electrode via the second insulation layer.

Wherein the TFT substrate further comprises: a scanning line being arranged on the same layer with the gate electrode on the substrate, the first insulation layer further covers the scanning line, and the active layer has not covered the scanning line; a second black matrix being arranged on the scanning line, and the second black matrix being arranged on the same layer with the first black matrix; and an capacitance electrode being arranged on the second black matrix, the capacitance electrode being arranged on the same layer with the source electrode and the drain electrode, and the pixel electrode being electrically connected to the capacitance electrode via the second insulation layer.

Wherein the first black matrix and the second black matrix respectively comprises contacting holes such that the source electrode and the drain electrode being contacted with the active layer via the contacting hole on the first black matrix, and the capacitance electrode being contacted with the first insulation layer via the contacting hole on the second black matrix.

Wherein the TFT substrate further comprises: a photoresist layer being arranged between the pixel electrode and the second insulation layer; and an insulation protection layer being arranged between the photoresist layer and the pixel electrode.

Wherein a first contacting hold and a second contacting hole are respectively formed in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed; the insulation protection layer is formed within the first contacting hole and the second contacting hole; a third contacting hole is formed within the insulation protection layer of the first contacting hole and the second contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

In view of the above, by arranging the black matrix on the active layer and by forming the source electrode and drain electrode on the black matrix, the black matrix is capable of masking the corresponding lights even the panel has been curved.

DETAILED DESCRIPTION OF THE EMBODIMENTS

Embodiments of the invention will now be described more fully hereinafter with reference to the accompanying drawings, in which embodiments of the invention are shown.

Figure 1:
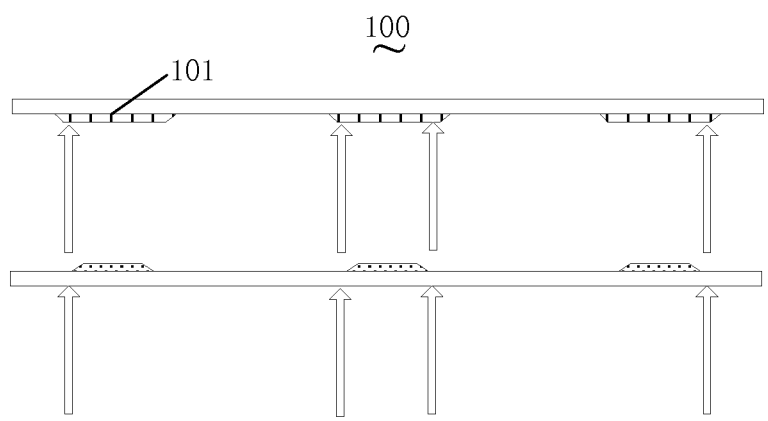
FIG. 1 shows the masking effect of the BM when the panel has not been curved.
Figure 2:
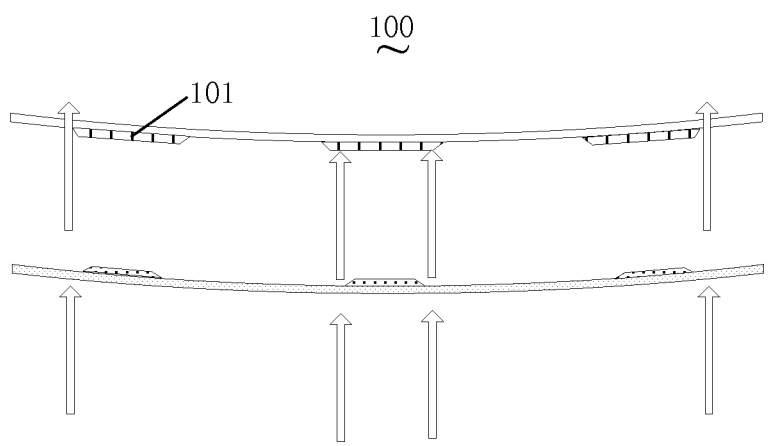
FIG. 2 shows the masking effect of the BM when the panel has been curved.
Figure 3:
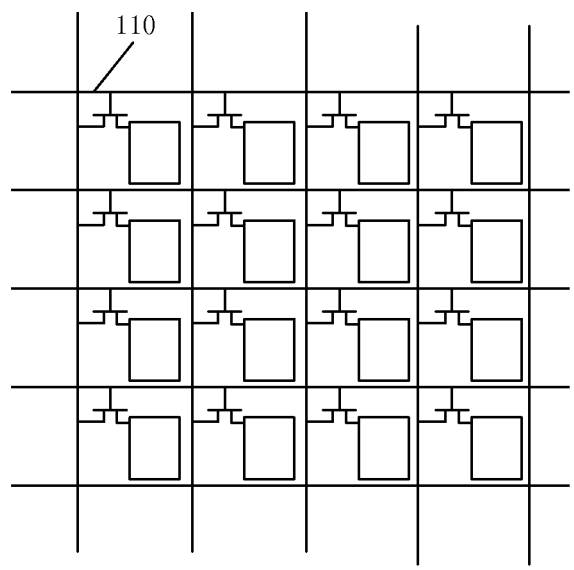
FIG. 3 is a schematic view of the TFT substrate in accordance with one embodiment.

FIG. 3 is a schematic view of the TFT substrate in accordance with one embodiment. The TFT substrate 10 includes a plurality of pixel cells 110. The structure of the pixel cells 110 are substantially the same. The structure of an pixel cell 110 will be taken as an example hereinafter.

Figure 4:
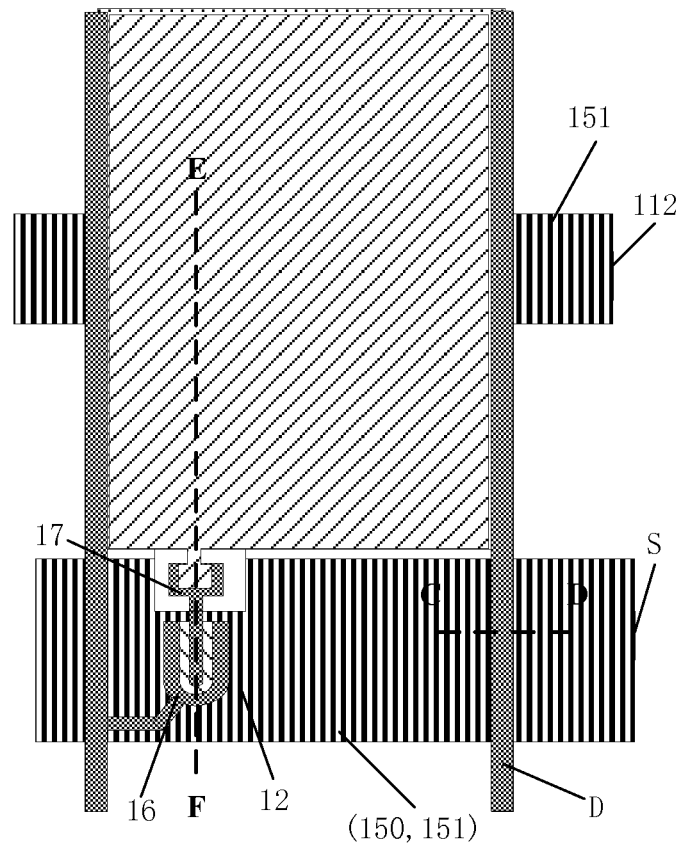
FIG. 4 is a schematic view of one pixel cell of the TFT substrate of FIG. 3.
Figure 5:
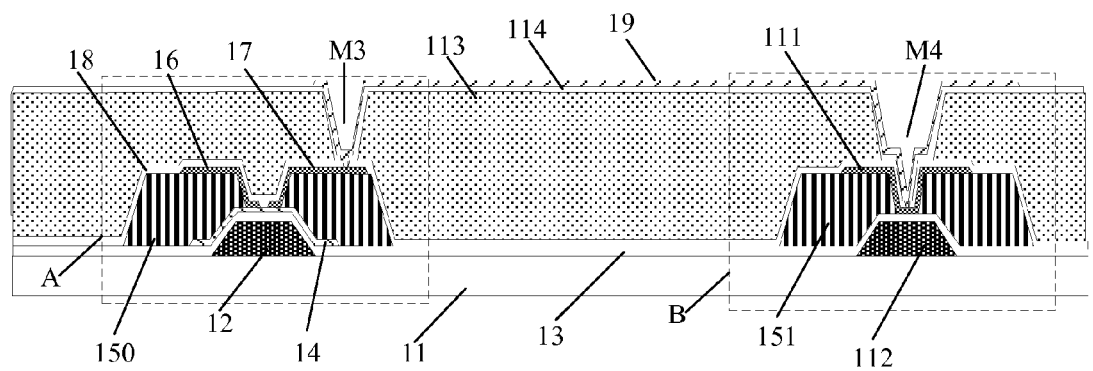
FIG. 5 is a cross section view of the pixel cell of FIG. 4 along the dashed line "EF".
Figure 6:
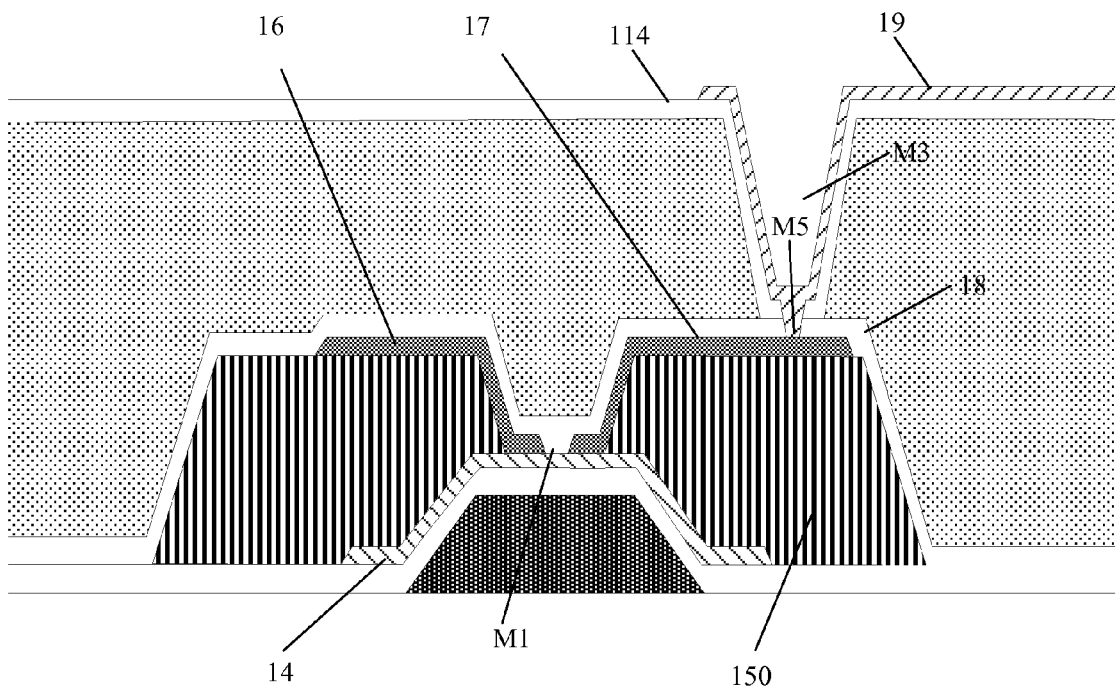
FIG. 6 is an enlarged view of the area A of FIG. 5.
Figure 7:
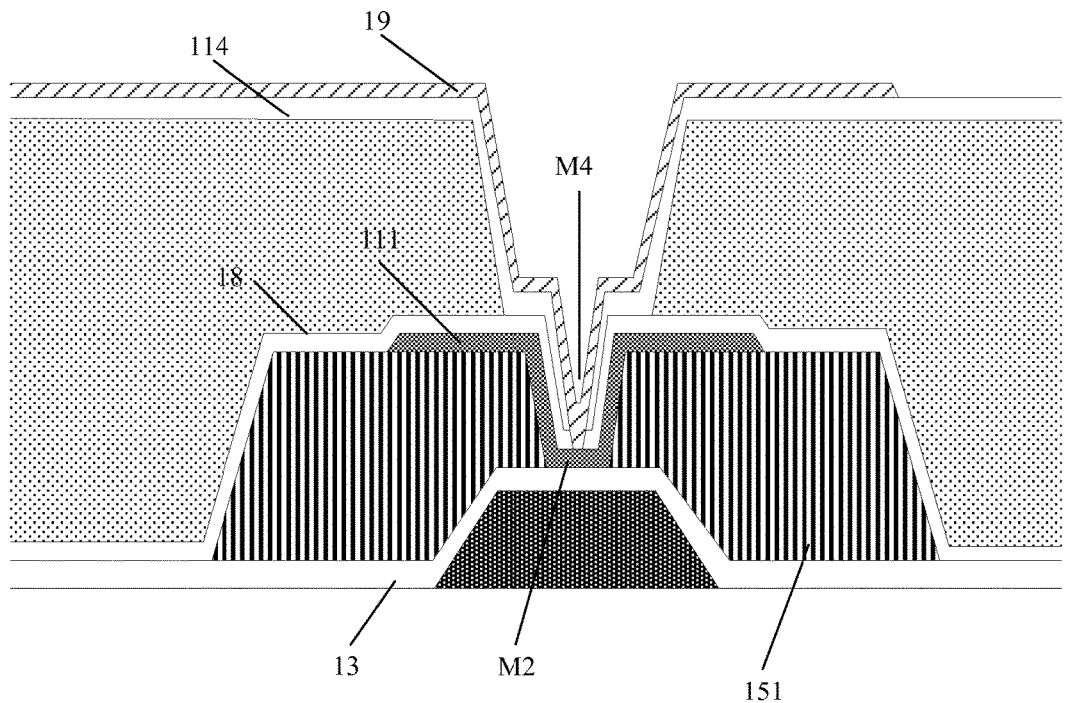
FIG. 7 is an enlarged view of the area B of FIG. 5.

FIG. 4 is a schematic view of one pixel cell of the TFT substrate of FIG. 3. FIG. 5 is a cross section view of the pixel cell of FIG. 4 along the dashed line "EF". FIG. 6 is an enlarged view of the area A of FIG. 5. FIG. 7 is an enlarged view of the area B of FIG. 5. Referring to FIGS. 4 and 5, the pixel cells 110 includes a substrate 11, a gate electrode 12, an active layer 14, a BM 150, a source electrode 16, a drain electrode 17, a second insulation layer 18, and a pixel electrode 19.

The gate electrode 12 is arranged on the substrate 11. The data line 13 and the active layer 14 are arranged on the gate electrode 12 in turn. The BM 150 is arranged on the active layer 14. The source electrode 16 and the drain electrode 17 are arranged on the BM 150. The second insulation layer 18 is arranged on the source electrode 16 and the drain electrode 17. The pixel electrode 19 may be Indium Tin Oxide (ITO) transparent electrode arranged on the second insulation layer 18. The pixel electrode 19 electrically connects to the drain electrode 17 via the second insulation layer 18. In other embodiments, the pixel electrode 19 may electrically connect to the source electrode 16 via the second insulation layer 18.

Figure 8:
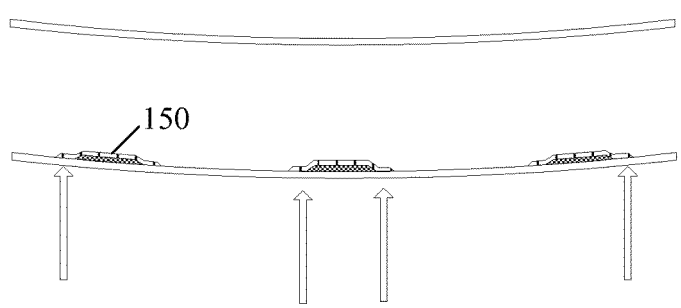
FIG. 8 shows the masking effect of the BM 101 when the panel assembled by the TFT substrate has been curved.

Thus, in the embodiment, as the BM 150 is arranged on the side of the TFT substrate 10, the masking effect of the BM 150 may not be affected when the panel assembled by the TFT substrate 10 has been curved. As shown in FIG. 8, the contrastness of the panel assembled by the TFT substrate 10 is enhanced.

On the other hand, as the BM 150 may be made by black resin material, and the manufacturing temperature of the active layer 14 is usually 400 degrees. Under the temperature, the black resin material may greatly aging and may be carbonized to cause fire. By arranging the BM 150 on the active layer 14, the BM 150 is formed after the active layer 14 is formed so as to avoid the above aging or fire issue. Not only the manufacturing process may be smoothly conducted, but also the performance of the BM 150 may be ensured.

Figure 9:
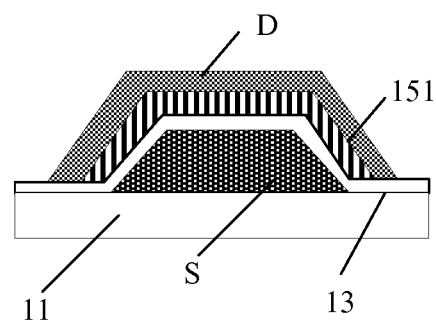
FIG. 9 is a cross section view of the pixel cell of FIG. 4 along the dashed line "CD".

FIG. 9 is a cross section view of the pixel cell of FIG. 4 along the dashed line "CD". As shown in FIGS. 4 and 9, the pixel cell 110 of the TFT substrate 10 also include a scanning line (S), a data line (D), and a BM 151.

The scanning line (S) is arranged on the substrate 11 and is arranged on the same layer with the gate electrode 12. The data line 13 covers the scanning line (S). The active layer 14 has not covered the scanning line (S). The BM 151 is arranged on the scanning line (S) and is arranged on the same layer with the BM 150. The data line (D) is arranged on the BM 151, and is arranged on the same layer with the source electrode 16 and the drain electrode 17. In the embodiment, as the data line 13 covers the scanning line (S), the BM 151 is arranged on the data line 13. In the embodiment, as the BM 151 is arranged between the data line (D) and the scanning line (S), the insulation between the data line (D) and the scanning line (S) has been increased, which decreases the coupling capacitance between the data line (D) and the scanning line (S). As such, the stability of the transmission between the data line (D) and the scanning line (S) is enhanced.

Also referring to FIG. 5, the pixel cell 110 of the TFT substrate 10 further includes capacitance electrodes 111, 112 forming a common capacitance. The capacitance electrode 112 is arranged on the substrate 11, and is arranged on the same layer with the scanning line (S) and the gate electrode 12. The data line 13 further covers the capacitance electrode 112. The BM 151 is arranged on a corresponding capacitance electrode 112 of the first insulation layer 13. The capacitance electrode 111 is arranged on the BM 151, and is arranged on the same layer with the source electrode 16 and the drain electrode 17. The second insulation layer 18 further covers the capacitance electrode 111. The pixel electrode 19 electrically connects to the capacitance electrode 111 via the second insulation layer 18.

Also referring to FIGS. 6 and 7, the BM 150 and the BM 151 are respectively formed with contacting holes M1, M2 such that the source electrode 16 and the drain electrode 17 contact with the active layer 14 via the contacting hole M1 on the BM 150. In addition, the capacitance electrode 111 contact with the first insulation layer 13 via the contacting hole M2 on the BM 151.

In the embodiment, the TFT substrate 10 further includes a photoresist layer 113 and an insulation protection layer 114. The photoresist layer 113 is arranged between the second insulation layer 18 and the pixel electrode 19. The insulation protection layer 114 is arranged between the photoresist layer 113 and the pixel electrode 19. The photoresist layer 113 is made by red (R), green (G), and blue (B) materials. As the insulation protection layer 114 is formed on the photoresist layer 113, the photoresist layer 113 and the components covered by the photoresist layer 113 may be well protected.

A first contacting hole M3 and a second contacting hole M4 are respectively formed are formed in locations on the photoresist layer 113 corresponding to the drain electrode 17 and the capacitance electrode 111. The second insulation layer 18 is exposed by the first contacting hole M3. The second contacting hole M4 passes through the second insulation layer 18 such that the capacitance electrode 111 is exposed.

The insulation protection layer 114 is arranged within the first contacting hole M3 and the second contacting hole M4. The insulation protection layer 114 within the first contacting hole M3 and the second insulation layer 18 form a third contacting hole M5. The third contacting hole M5 exposes the drain electrode 17. The insulation protection layer 114 within the second contacting hole M4 is arranged on the second insulation layer 18 in which the second contacting hole M4 has not been covered. The pixel electrode 19 electrically connects to the drain electrode 17 via the third contacting hole M5. In addition, the pixel electrode 19 electrically connects to the capacitance electrode 111 via the second contacting hole M4.

In other embodiments, the first contacting hole M3 may be formed in a location on the photoresist layer 113 corresponding to the source electrode 16 so as to expose the second insulation layer 18. Similarly, the third contacting hole M5 is arranged corresponding to the location of the source electrode 16. The third contacting hole M5 exposes the source electrode 16. The pixel electrode 19 electrically connects to the source electrode 16 via the third contacting hole M5.

As stated above, in the embodiment, as the BM 150 is arranged on the side of the TFT substrate 10, the masking effect of the BM 150 may not be affected when the panel assembled by the TFT substrate 10 has been curved. As shown in FIG. 8, the contrastness of the panel assembled by the TFT substrate 10 is enhanced.

On the other hand, as the BM 151 is arranged between the data line (D) and the scanning line (S), the insulation between the data line (D) and the scanning line (S) has been increased, which decreases the coupling capacitance between the data line (D) and the scanning line (S). As such, the stability of the transmission between the data line (D) and the scanning line (S) is enhanced.

Figure 10:
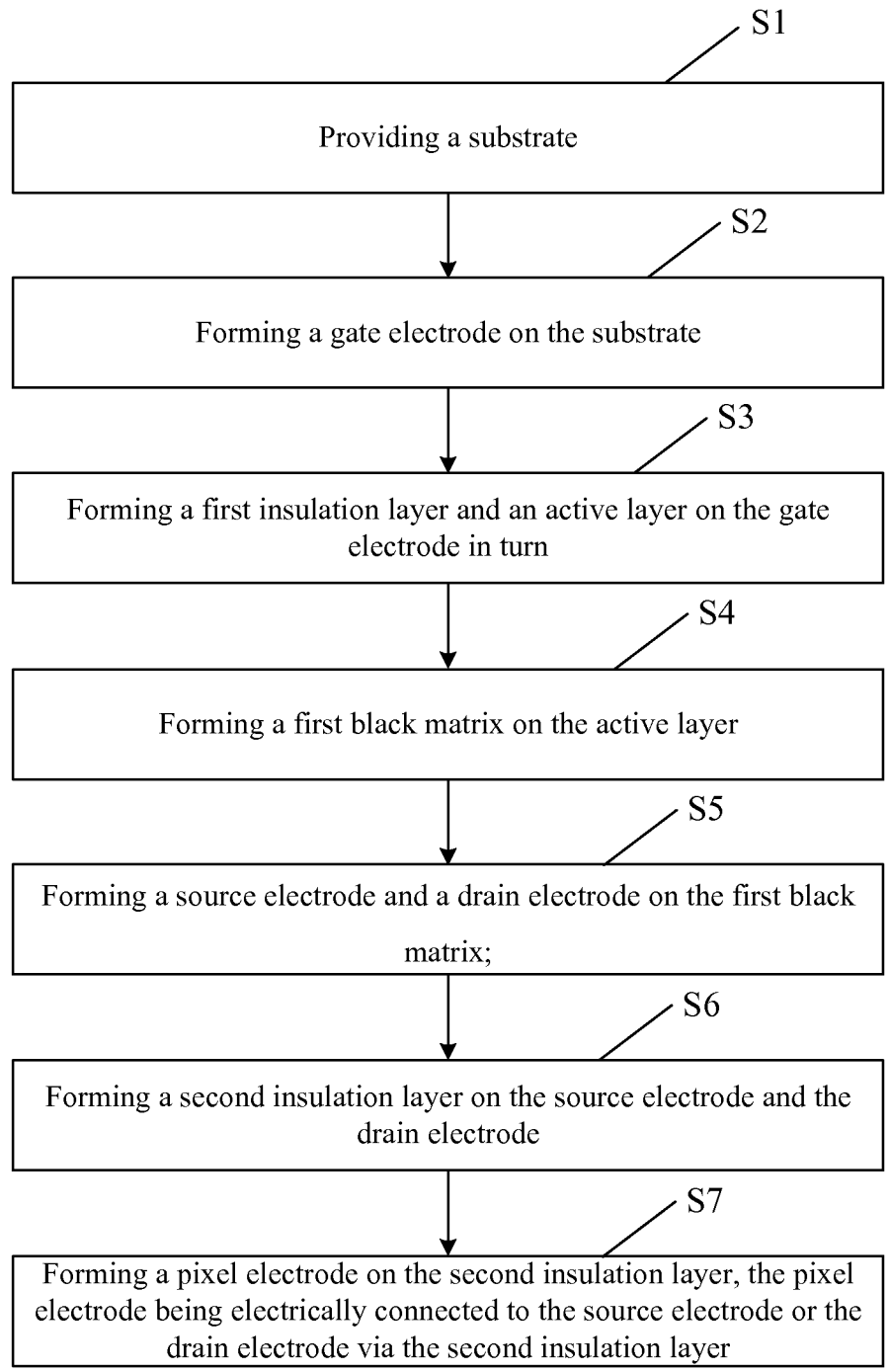
FIG. 10 is a flowchart of the manufacturing method of the TFT substrate in accordance with one embodiment.
Figure 11:
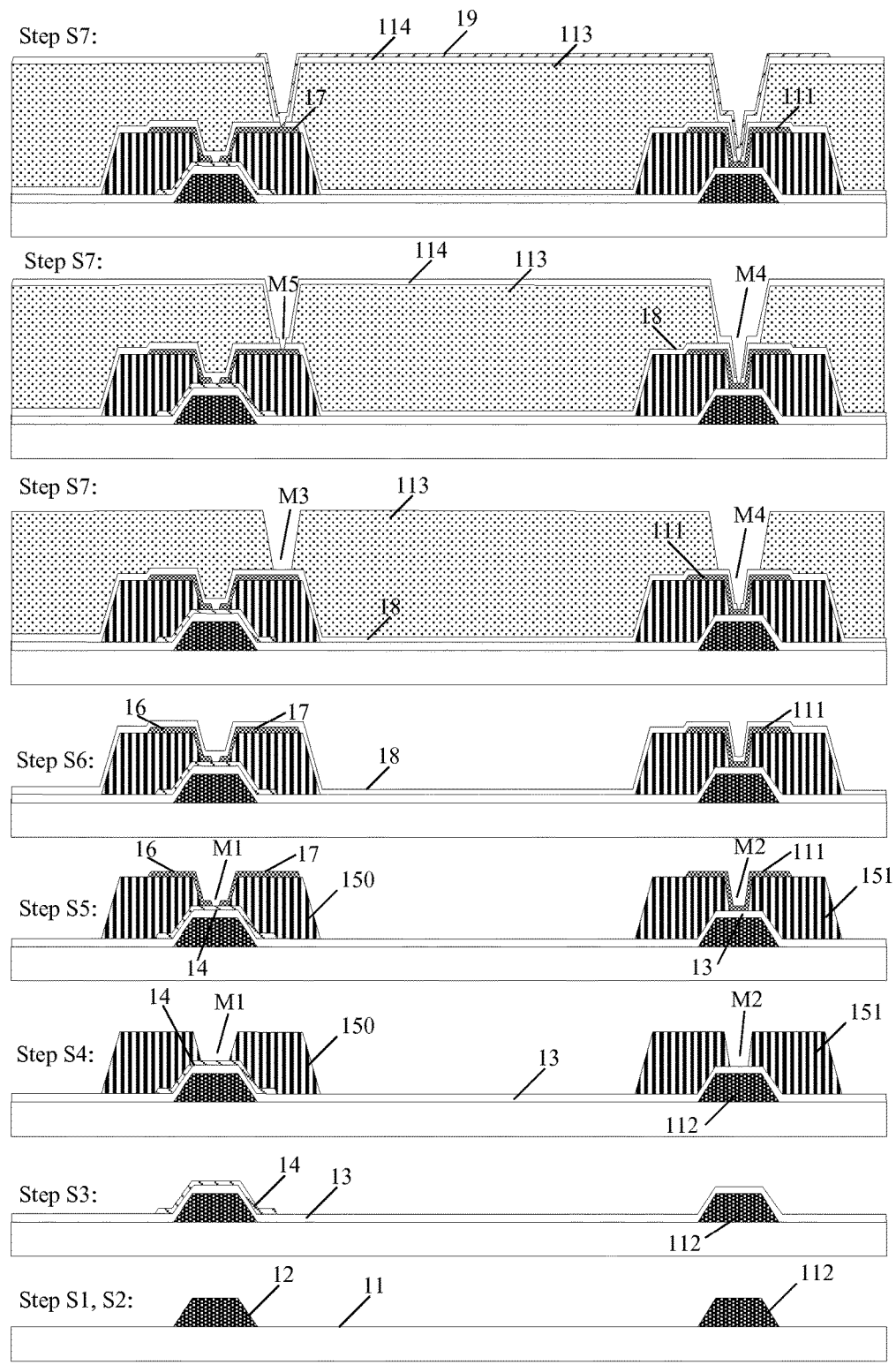
FIGS. 11-12 is a flowchart of the manufacturing method of the TFT substrate of FIG. 10.
Figure 12:
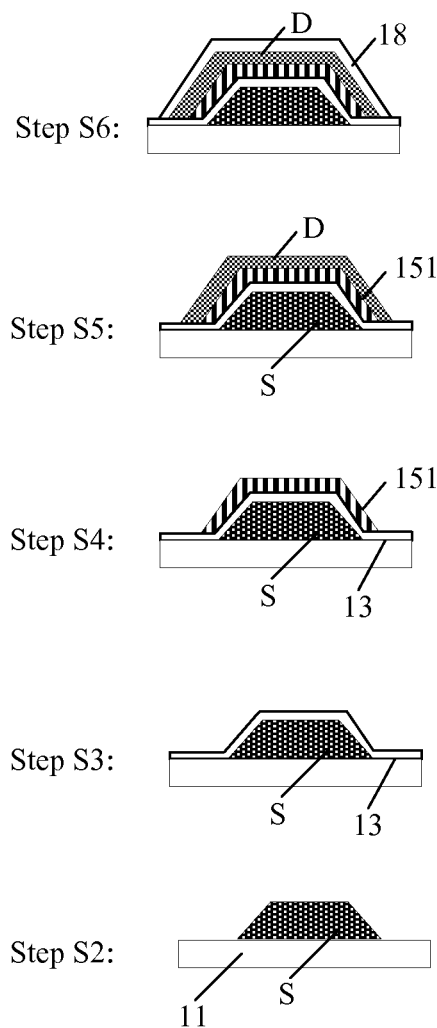

FIG. 10 is a flowchart of the manufacturing method of the TFT substrate in accordance with one embodiment. FIGS. 11-12 is a flowchart of the manufacturing method of the TFT substrate of FIG. 10.

In block S1, a substrate 11 is provided. In block S2, the gate electrode 12 is formed on the substrate 11. In addition, as shown in FIG. 12, the capacitance electrode 112 and the scanning line (S) being arranged on the same layer with the gate electrode 12 is formed on the substrate 11

In block S3, the first insulation layer 13 and the active layer 14 are formed on the gate electrode 12 in turn. In addition, the first insulation layer 13 further covers the capacitance electrode 112 and the scanning line (S). The active layer 14 has not covered the capacitance electrode 112 and the scanning line (S).

In block S4, the BM 150 is formed on the active layer 14. In addition, the BM 151 being arranged on the same layer with the BM 150 is formed on the scanning line (S) and the capacitance electrode 112. As the first insulation layer 13 covers the capacitance electrode 112 and the scanning line (S), the BM 151 being arranged on the same layer with the BM 150 is respectively formed on the first insulation layer 13 corresponding to the scanning line (S) and the capacitance electrode 112.

In block S5, the source electrode 16 and the drain electrode 17 are formed on the BM 150. In addition, as shown in FIG. 12, the data line (D) and the capacitance electrode 111 being arranged on the same layer with the source electrode 16 and the drain electrode 17 are formed on the BM 151.

In block S4, the BM 150 and the BM 151 are respectively formed with contacting holes M1, M2 such that the source electrode 16 and the drain electrode 17 contact with the active layer 14 via the contacting hole M1 on the BM 150. In addition, the capacitance electrode 111 contact with the first insulation layer 13 via the contacting hole M2 on the BM 151.

In block S6, the second insulation layer 18 is formed on the source electrode 16 and the drain electrode 17. The second insulation layer 18 covers the data line (D) and the capacitance electrode 111.

In block S7, the pixel electrode 19 is formed on the second insulation layer 18. The pixel electrode 19 electrically connects to the source electrode 16 or the drain electrode 17 via the second insulation layer 18.

In the embodiment, the pixel electrode 19 electrically connects to the drain electrode 17 via the second insulation layer 18. The pixel electrode 19 electrically connects to the capacitance electrode 111 via the second insulation layer 18.

In addition, before the pixel electrode 19 is formed, the photoresist layer 113 is formed on the second insulation layer 18. The insulation protection layer 114 is formed on the photoresist layer 113. Lastly, the pixel electrode 19 is formed on the insulation protection layer 114. That is, the photoresist layer 113 is formed between the pixel electrode 19 and the second insulation layer 18. The insulation protection layer 114 is formed between the photoresist layer 113 and the insulation protection layer 114. As the insulation protection layer 114 is formed on the photoresist layer 113, the photoresist layer 113 and the components covered by the photoresist layer 113 may be well protected.

In the embodiment, the pixel electrode 19 electrically connects to the drain electrode 17 and to the capacitance electrode 111 via the second insulation layer 18. The detailed steps will be described hereinafter.

A first contacting hole M3 and a second contacting hole M4 are formed are respectively formed in locations on the photoresist layer 113 respectively corresponding to the drain electrode 17 and the capacitance electrode 111. The second insulation layer 18 is exposed by the first contacting hole M3. The second contacting hole M4 passes through the second insulation layer 18 such that the capacitance electrode 111 is exposed.

When the insulation protection layer 114 is formed on the photoresist layer 113, the insulation protection layer 114 is arranged within the first contacting hole M3 and the second contacting hole M4 at the same time. The insulation protection layer 114 within the first contacting hole M3 and the second insulation layer 18 form a third contacting hole M5. The third contacting hole M5 exposes the drain electrode 17. The insulation protection layer 114 within the second contacting hole M4 is arranged on the second insulation layer 18 in which the second contacting hole M4 has not been covered. The pixel electrode 19 electrically connects to the drain electrode 17 via the third contacting hole M5. In addition, the pixel electrode 19 electrically connects to the capacitance electrode 111 via the second contacting hole M4.

In other embodiments, the first contacting hole M3 may be formed in a location on the photoresist layer 113 corresponding to the source electrode 16 such that the third contacting hole M5 corresponds to the location of the source electrode 16. In this way, the pixel electrode 19 electrically connects to the source electrode 16 via the third contacting hole M5.

In view of the above, in the embodiment, as the BM 150 is arranged on the side of the TFT substrate 10, the masking effect of the BM 150 may not be affected when the panel assembled by the TFT substrate 10 has been curved. As shown in FIG. 8, the contrastness of the panel assembled by the TFT substrate 10 is enhanced.

On the other hand, as the BM 150, 151 may be made by black resin material, and the manufacturing temperature of the active layer 14 is usually 400 degrees. Under the temperature, the black resin material may greatly aging and may be carbonized to cause fire. By arranging the BM 150, 151 on the active layer 14, the BM 150, 151 are formed after the active layer 14 is formed so as to avoid the above aging or fire issue. Not only the manufacturing process may be smoothly conducted, but also the performance of the BM 150, 151 may be ensured.

In addition, as the BM 151 is arranged between the data line (D) and the scanning line (S), the insulation between the data line (D) and the scanning line (S) has been increased, which decreases the coupling capacitance between the data line (D) and the scanning line (S). As such, the stability of the transmission between the data line (D) and the scanning line (S) is enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of a thin film transistor (TFT) substrate, comprising:
   providing a substrate;
   forming a gate electrode on the substrate;
   forming a first insulation layer and an active layer on the gate electrode in turn;
   forming a first black matrix on the active layer;
   forming a source electrode and a drain electrode on the first black matrix;
   forming a second insulation layer on the source electrode and the drain electrode;
   forming a pixel electrode on the second insulation layer, the pixel electrode being electrically connected to the source electrode or the drain electrode via the second insulation layer;
   wherein the step of forming the gate electrode further comprises forming at least one scanning line on the substrate, the scanning line being arranged on the same layer with the gate electrode, and wherein the first insulation layer further covers the scanning line, and the active layer has not covered the scanning line;
   wherein the step of forming the first black matrix further comprises forming a second black matrix on the scanning line, and the second black matrix being arranged on the same layer with the first black matrix;

wherein the step of forming the source electrode and the drain electrode on the first black matrix further comprises forming a capacitance electrode on the second black matrix, the capacitance electrode being arranged on the same layer with the source electrode and the drain electrode, wherein the second insulation layer further covers the capacitance electrode, and the pixel electrode being electrically connected to the capacitance electrode via the second insulation layer; and wherein the first black matrix and the second matrix are made by black resin material; the method further comprises:

forming a photoresist layer between the pixel electrode and the second insulation layer; and forming an insulation protection layer between the photoresist layer and the pixel electrode;

wherein the step of forming the photoresist layer between the pixel electrode and the second insulation layer further comprises forming a first contacting hole and a second contacting hole respectively in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed;

wherein the step of forming the insulation protection layer between the photoresist layer and the pixel electrode further comprises:

forming the insulation protection layer within the first contacting hole and the second contacting hole;

forming a third contacting hole within the insulation protection layer of the first contacting hole and the second contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

2. The method as claimed in claim 1, wherein the step of forming the first black matrix on the active layer further comprises:

forming contacting holes respectively on the first black matrix and the second black matrix such that the source electrode and the drain electrode being contacted with the active layer via the contacting hole on the first black matrix, and the capacitance electrode being contacted with the first insulation layer via the contacting hole on the second black matrix.

3. A manufacturing method of a thin film transistor (TFT) substrate, comprising:

providing a substrate;

forming a gate electrode on the substrate;

forming a first insulation layer and an active layer on the gate electrode in turn;

forming a first black matrix on the active layer;

forming a source electrode and a drain electrode on the first black matrix;

forming a second insulation layer on the source electrode and the drain electrode; and forming a pixel electrode on the second insulation layer, the pixel electrode being electrically connected to the source electrode or the drain electrode via the second insulation layer;

wherein the step of forming the gate electrode further comprises:

forming at least one scanning line on the substrate, the scanning line being arranged on the same layer with the gate electrode, and wherein the first insulation layer further covers the scanning line, and the active layer has not covered the scanning line;

wherein the step of forming the first black matrix further comprises forming a second black matrix on the scanning line, and the second black matrix being arranged on the same layer with the first black matrix; and wherein the step of forming the source electrode and the drain electrode on the first black matrix further comprises forming a capacitance electrode on the second black matrix, the capacitance electrode being arranged on the same layer with the source electrode and the drain electrode, wherein the second insulation layer further covers the capacitance electrode, and the pixel electrode being electrically connected to the capacitance electrode via the second insulation layer;

wherein the method further comprises:

forming a photoresist layer between the pixel electrode and the second insulation layer; and forming an insulation protection layer between the photoresist layer and the pixel electrode;

wherein the step of forming the photoresist layer between the pixel electrode and the second insulation layer further comprises forming a first contacting hole and a second contacting hole respectively in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed;

wherein the step of forming the insulation protection layer between the photoresist layer and the pixel electrode further comprises:

forming the insulation protection layer within the first contacting hole and the second contacting hole;

forming a third contacting hole within the insulation protection layer of the first contacting hole and the third contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

4. The method as claimed in claim 3, wherein the step of forming the first black matrix on the active layer further comprises:

forming contacting holes respectively on the first black matrix and the second black matrix such that the source electrode and the drain electrode being contacted with the active layer via the contacting hole on the first black matrix, and the capacitance electrode being contacted with the first insulation layer via the contacting hole on the second black matrix.

5. A thin film transistor (TFT) substrate, comprising:

a substrate;

a gate electrode being arranged on the substrate;

a first insulation layer and an active layer being arranged on the gate electrode in turn;

a first black matrix being arranged on the active layer;

a source electrode and a drain electrode being arranged on the first black matrix;

a second insulation layer being arranged on the source electrode and the drain electrode; and a pixel electrode being arranged on the second insulation layer, and he pixel electrode being electrically connected to the source electrode or the drain electrode via the second insulation layer;

wherein the TFT substrate further comprises:

a scanning line being arranged on the same layer with the gate electrode on the substrate, the first insulation layer further covers the scanning line, and the active layer has not covered the scanning line;

a second black matrix being arranged on the scanning line, and the second black matrix being arranged on the same layer with the first black matrix; and an capacitance electrode being arranged on the second black matrix, the capacitance electrode being arranged on the same layer with the source electrode and the drain electrode, and the pixel electrode being electrically connected to the capacitance electrode via the second insulation layer;

wherein the TFT substrate further comprises:

a photoresist layer being arranged between the pixel electrode and the second insulation layer; and an insulation protection layer being arranged between the photoresist layer and the pixel electrode;

wherein a first contacting hole and a second contacting hole are respectively formed in locations on the photoresist layer corresponding to the source or drain electrode and the capacitance electrode, wherein the second insulation layer being exposed by the first contacting hole, and the second contacting hole being passed through the second insulation layer such that the capacitance electrode being exposed;

the insulation protection layer is formed within the first contacting hole and the second contacting hole;

a third contacting hole is formed within the insulation protection layer of the first contacting hole and the second contacting hole, the insulation protection layer within the second contacting hole being arranged on the second insulation layer, wherein the pixel electrode being electrically connected to the drain electrode or the source electrode via the third contacting hole, and the pixel electrode being electrically connected to the capacitance electrode via the second contacting hole.

6. The TFT substrate as claimed in claim 5, wherein the first black matrix and the second black matrix respectively comprises contacting holes such that the source electrode and the drain electrode being contacted with the active layer via the contacting hole on the first black matrix, and the capacitance electrode being contacted with the first insulation layer via the contacting hole on the second black matrix.

\* \* \* \* \*